United States Patent [19]

McKenzie et al.

[11] Patent Number: 4,599,604
[45] Date of Patent: Jul. 8, 1986

[54] A/D SELF-TESTING CIRCUIT

[75] Inventors: James A. McKenzie; Joe W. Peterson, both of Austin, Tex.

[73] Assignee: Motorola, Inc., Schaumburg, Ill.

[21] Appl. No.: 644,837

[22] Filed: Aug. 27, 1984

[51] Int. Cl.[4] .............................................. H03M 1/10
[52] U.S. Cl. ........................ 340/347 AD; 340/347 CC
[58] Field of Search ................... 340/347 CC, 347 AD

[56] References Cited

U.S. PATENT DOCUMENTS

| 4,399,426 | 8/1983 | Tan | 340/347 CC |
| 4,412,208 | 10/1983 | Akazawa et al. | 340/347 CC |
| 4,415,882 | 11/1983 | Akazawa et al. | 340/347 CC |
| 4,451,821 | 5/1984 | Domogalla | 340/347 CC |

Primary Examiner—L. T. Hix
Assistant Examiner—David M. Gray

Attorney, Agent, or Firm—Anthony J. Sarli, Jr.; Jeffrey Van Myers; Robert L. King

[57] ABSTRACT

An A/D system having a capacitive DAC is provided with a circuit for accurately testing the functionality of the A/D system. An accurate reference voltage which is associated with A/D systems is utilized directly by selectively coupling the accurate reference voltage to predetermined ones of a plurality of rank ordered capacitors forming a binarily weighted DAC via a plurality of switches. After charging the predetermined capacitors, an effective test voltage results which is then coupled by the switches to successive approximation circuitry associated with the A/D system. A resulting digital output code may be compared with the weighted analog value of the switched reference voltage to test whether the circuitry of the A/D system is functioning properly.

7 Claims, 1 Drawing Figure

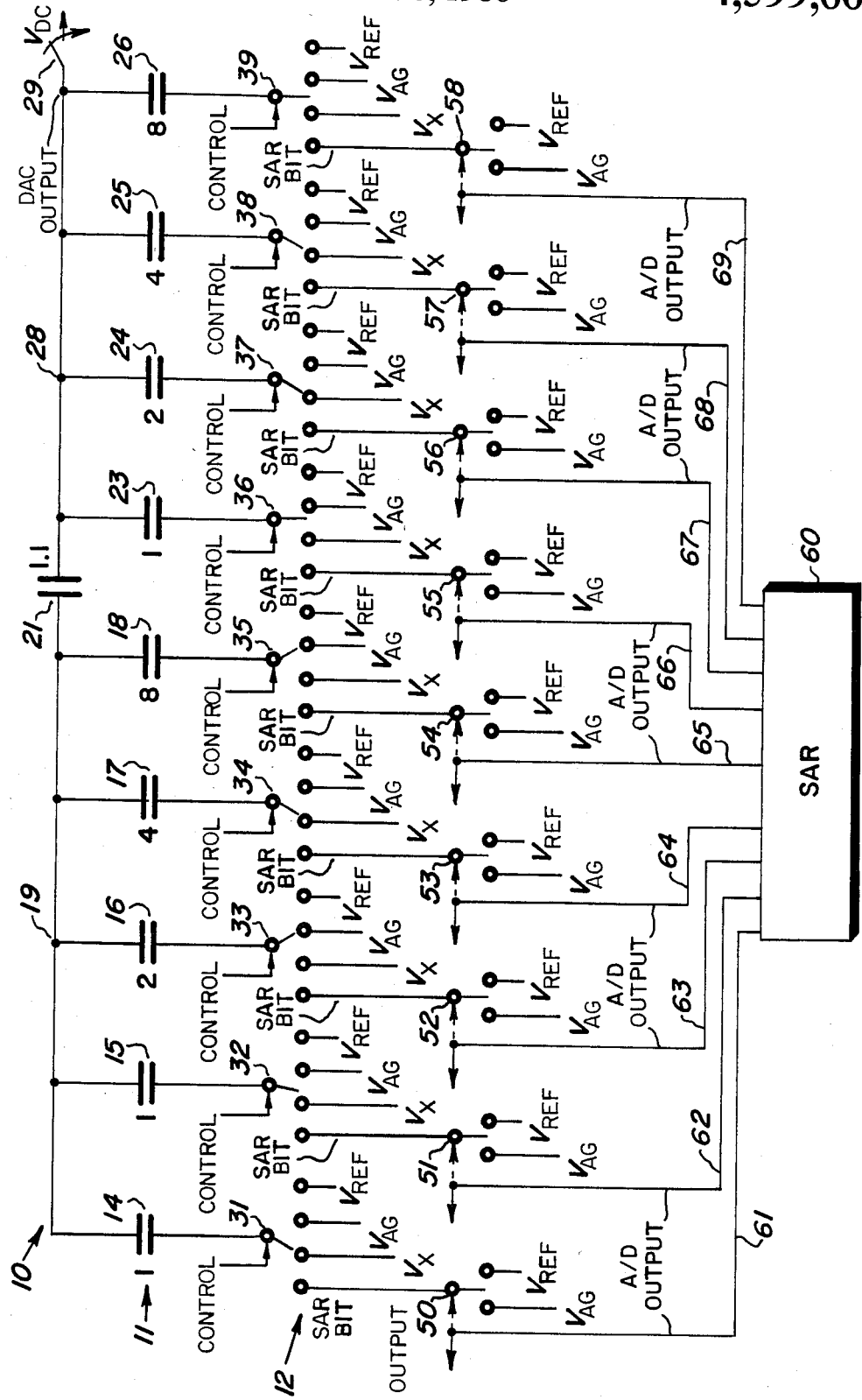

A/D SELF-TESTING CIRCUIT

TECHNICAL FIELD

This invention relates generally to analog to digital converters, and more specifically, to successive approximation analog to digital converters which may be readily tested for accuracy.

BACKGROUND ART

Typically, analog to digital (A/D) converters are periodically tested in a system environment to determine if the A/D converter is functioning properly. An A/D converter can be tested by sampling a known voltage and determining if an accurate converted output is provided. The problem previously associated with tests of A/D converters have been related to the accuracy of the known voltage which is used to perform the test. A sampling voltage of the required accuracy is generally difficult to generate. Typical resistor voltage divider circuits do not provide a sampling voltage which is accurate enough. When conventional precision voltage reference circuits are used, substantial circuit size is dedicated for the single purpose of a test voltage function.

SUMMARY OF THE INVENTION

Accordingly, an object of the present invention is to provide an improved A/D self-testing converter.

Another object of the present invention is to provide an improved A/D converter having an accurate test voltage used to test the accuracy of the converter.

Yet another object of the present invention is to provide a self-testing A/D converter which minimizes circuit area and power consumption.

In carrying out the above and other objects of the present invention, there is provided, in one form, a circuit for testing the functionality of an analog to digital (A/D) converter system. The test circuit is used in conjunction with the system which operates in a conventional manner when the test circuit is not utilized. The system has an accurate reference voltage associated therewith and a capacitive digital to analog converter (DAC). The digital to analog converter has a plurality of rank ordered capacitors, all of the capacitors having first and second electrodes. The first electrodes of the capacitors are coupled together for providing a DAC output which is selectively coupled to a D.C. bias voltage. A first plurality of rank ordered switching means is provided with each switching means having a first terminal coupled to a predetermined second electrode of the capacitors of corresponding rank. The first terminal of each switch is selectively coupled between the accurate system reference voltage, a second reference voltage, a terminal coupled to an unknown voltage, and a successive approximation register (SAR) terminal. A first plurality of control signals controls the switching of the first plurality of switches. A second plurality of rank ordered switches is coupled to the successive approximation register and selectively couples the first and second reference voltages to a respective SAR terminal in response to a control signal provided by a successive approximation register. A digital result is provided by the successive approximation register which may be readily used to determine the functionality of the system.

BRIEF DESCRIPTION OF THE DRAWING

The single FIGURE is a schematic diagram of a self-testing A/D converter constructed in accordance with the present invention.

DETAILED DESCRIPTION OF THE INVENTION

Shown in the Figure is a binarily weighted capacitive D/A converter (DAC) 10 which is used within a successive approximation A/D converter. DAC 10 generally comprises a capacitive portion 11 and a switching portion 12. CApacitive portion 11 has a plurality of low ordered capacitors 14, 15, 16, 17 and 18 which in a preferred form are weighted 1, 1, 2, 4 and 8 units, respectively. Capacitors 14, 15, 16, 17 and 18 each have an electrode connected together at a node 19. A scaling capacitor 21 has a first electrode connected to node 19. In a preferred form, capacitor 21 is weighted 1.1 units. Capacitive portion 11 also has a plurality of high ordered capacitors 23, 24, 25 and 26 which in a preferred form are weighted 1, 2, 4 and 8 units, respectively. Capacitors 23, 24, 25 and 26 each have a first electrode connected together and to a second electrode of scaling capacitor 21 at a node 28 for providing the DAC output. A switch 29 has a first terminal connected to node 28 and a second terminal connected to a D.C. bias voltage source, $V_{DC}$.

Switching portion 12 comprises a plurality of switches 31, 32, 33, 34, 35, 36, 37, 38 and 39 which have a first terminal connected to a second electrode of capacitors 14, 15, 16, 17, 18, 23, 24, 25 and 26, respectively. Switches 31–39 are each selectively switched between four terminals labeled "SAR Bit", "$V_X$", "$V_{AG}$" and "$V_{REF}$" in response to a first plurality of control signals provided by conventional external logic (not shown) which controls DAC 10 in the manner described below. The label "$V_{REF}$" represents a known accurate system reference voltage which is associated with every A/D converter system. The label "$V_{AG}$" represents an analog ground voltage and the label "$V_X$" is an unknown sample voltage. The "SAR BIT" terminal of switches 31–39 is connected to a first terminal of a plurality of switches 50, 51, 52, 53, 54, 55, 56, 57 and 58, respectively. The first terminals of switches 50–58 are each coupled between second and third terminals labeled "$V_{AG}$" (analog ground voltage) and "$V_{REF}$" (system reference voltage), respectively, in response to a second plurality of control signals provided by a successive approximation register (SAR) 60 via conductors 61, 62, 63, 64, 65, 66, 67, 68 and 69, respectively. Although switching portion 12 is shown for the purpose of illustration as having individual switches 31–39 and 50–58 with each switch being a multiple position switch, it should be obvious that the functionality of each of switches 31–39 may be obtained by using multiple switches having other numbers of switching terminals. Furthermore, any type of switch such as a conventional transistor transmission gate may be used to implement switches 31–39 and 50–58.

In operation, DAC 10 operates in a conversion mode and a self-test mode. DAC 10 functions in a conventional manner when in the conversion mode. In particular, in the conversion mode an unknown analog voltage $V_X$ which is to be converted to a digital output by the successive approximation A/D converter is sampled onto all the capacitors 14–18 and 23–26 while switch 29 is conductive. Switch 29 establishes a known D.C. bias voltage, $V_{DC}$, at output node 28 of DAC 10 while the second electrodes of capacitors 14-18 and 23-26 are charged to an unknown potential ($V_X$). Since binarily weighted DACs are well known in the art, a discussion of the effects of the associated capacitor weights will not be given. It should be noted that the values of the capacitor weights are irrelevant for purposes of the present invention and the values shown in the Figure are for purposes of illustration only. Furthermore, although conventional half-bit correction is not illustrated in the Figure, it should be readily apparent that the present invention may be used with DACs which have half-bit correction. After a predetermined settling time, switches 31-39 are each switched from $V_X$ to the "SAR Bit" to be coupled to either first or second reference voltages, $V_{AG}$ or $V_{REF}$, respectively, in response to the second plurality of rank ordered control signals provided by SAR 60 and associated successive approximation circuitry of the A/D converter. Simultaneously, switch 29 is made nonconductive. At this point in time, the voltage output at node 28 is proportional to the difference in the unknown analog voltage $V_X$ and the binarily weighted equivalent voltage represented by the successive approximation output referenced to $V_{DC}$. The successive approximation circuitry determines whether the closest digital value of the unknown analog input voltage has been provided and SAR 60 provides a control signal which is either a logic "1" or "0" to each of switches 50-58. The control signals cause switches 50-58 to couple either $V_{AG}$ or $V_{REF}$ to the respective second electrodes of capacitors 14-18 and 23-26 thru switches 31-39, respectively. It should be well understood that the logic level of each of the control signals for switches 50-58 functions as an A/D output bit and correlates to which reference voltage switches 50-58 are individually coupled to. After the successive approximation circuitry has determined that a digital output which most closely approximates the unknown analog input voltage has been provided, SAR 60 provides a binarily weighted digital output corresponding to the unknown analog input voltage at the terminals labeled "A/D Output".

In the self-test mode, DAC 10 is initially charged to the known accurate system reference voltage by switching the reference voltage $V_{REF}$ to predetermined ones of capacitors 14-18 and 23-26 while all other capacitors are switched to $V_{AG}$. The actual switching which occurs results from an arbitrary test code which is chosen by a user of the test mode. The resulting switching establishes a sampled voltage on capacitive portion 11 which is equal to the product of a ratio and $V_{REF}$. The ratio is the ratio of the weighted capacitive sum of the capacitors switched to $V_{REF}$ and the effective capacitive sum of all the capacitors. During the time the self-test voltage is sampled, switch 29 is conductive so that the known D.C. bias $V_{DC}$ is coupled to the DAC output node 28. After a sufficient settling time, switch 29 is opened and switches 31-39 are connected to the SAR Bit terminals. The normal successive approximation conversion associated with the A/D converter proceeds from that point. If the resulting converted digital output code correlates to the arbitrary test code which was used to selectively sample $V_{REF}$ onto the capacitors of DAC 10, a user may quickly determine that the circuitry associated with the successive approximation A/D converter is fully functional. If the successive approximation routine is functioning properly and the A/D converter functions properly, the A/D converter should replicate the exact same sum of capacitances that are charged during the sample phase. Every combination of switching of capacitors 14-18 and 23-26 gives a unique and particular sum because the DAC is binarily weighted.

Upon close scrutiny, it should be apparent that the present invention necessitates an accurate reference voltage to be used as a test voltage because accuracy in a ratiometric data acquisition system is directly proportional to the accuracy of an associated reference voltage. However, in the present invention a test voltage is not generated or derived from a system reference voltage. Rather, the present invention only "effects" an accurate test voltage by utilizing the full value of an available accurate reference voltage which is always present in an A/D system. Instead of generating a reference test voltage or dividing a given system reference voltage by means such as a resistive divider, the present invention uses the entire system reference voltage but only selectively samples the system reference voltage onto a portion of the capacitive DAC. The entire value of the reference voltage cannot be sampled onto all of the capacitors without providing a digital output of all ones. Such an output would never indicate whether or not multiple bits may be electrically shorted together since all bits are supposed to have a digital value of one when a test value equal to the entire system reference voltage is used. Therefore, others have generated a test voltage from an accurate system reference voltage having a fractional value of the reference voltage and sampled that smaller test voltage onto all capacitors of a capacitive DAC so that a digital test result other than all ones results. The problem with such prior test circuits has been the inaccuracy of the test voltage which was derived from the reference voltage with respect to process, temperature and other variations as previously mentioned.

The present invention however utilizes switching portion 12 to effectively switch the full value of the accurate system reference voltage to only a portion of the capacitors of the DAC. A plurality of combinations of switching the capacitors exists and each combination provides a unique digital output sum. In other words, because it is a binarily weighted D/A converter, only a single unique combination of switching will give a particular sum. The plurality of effective test voltages which may be chosen provides multiple opportunities to test the digital circuitry associated with an A/D converter in a very stable manner with the same or multiple test values.

By now it should be apparent that the present invention provides a self-test circuit and method for testing the circuitry associated with an A/D system. The present invention allows the A/D system to perform a self-test so that a system host such as a microprocessor may interrogate the A/D system and determine if the system is functioning properly from a majority functionality standpoint. The present invention consumes very little circuit area since the only additional circuitry added to a conventional DAC is a portion of the switches of switching portion 12. Power consumption is also minimized as no D.C. current path is generated in association with the reference voltage utilized herein.

We claim:

1. In an analog to digital converter system having an accurate system reference voltage and a capacitive digital to analog converter having a plurality of rank ordered capacitors, all of the capacitors having a first electrode coupled together for providing an analog output voltage and selectively coupled to a D.C. bias voltage, and each capacitor having a second electrode, a circuit for selectively testing the functionality of the analog to digital converter system by providing a digital output code to be correlated to a digital test code, comprising:

a first plurality of rank ordered switching means, each of said switching means having a first terminal coupled to a predetermined second electrode of the capacitors of corresponding rank, and a second terminal which may be selectively coupled to one of either an unknown analog voltage, the system reference voltage, a second reference voltage or one of a rank ordered plurality of approximation bit terminals, said digital test code selectively controlling each of the first plurality of switching means to selectively switch the second terminal of each switching means to either a full value of the system reference voltage or to the second reference voltage for precharging said capacitors to the digital test code value; and a second plurality of rank ordered switching means, each of said switching means of the second plurality having a first terminal coupled to a predetermined approximation bit terminal of corresponding rank, and a second terminal which may be selectively coupled to one of either the full value of the system reference voltage or to the second reference voltage in response to a predetermined bit of the digital output code resulting from an approximation of the digital test code.

2. The analog to digital converter system of claim 1 wherein the rank ordered capacitors are binarily weighted and comprise a lower ranked portion which is coupled to a higher ranked portion via a coupling capacitor.

3. The analog to digital converter system of claim 2 wherein said second reference voltage is an analog ground potential.

4. A method of self-testing an analog to digital system having an accurate system reference voltage, comprising the steps of:

providing a capacitive digital to analog converter having a plurality of rank ordered capacitors each having a first electrode coupled together and a second electrode;

providing a first plurality of rank ordered switches, each of the first plurality of switches having a terminal coupled to a predetermined second electrode of a capacitor of corresponding rank;

selectively charging each of the capacitors with an analog test voltage corresponding to a digital test code by coupling all of the system reference voltage via the first plurality of switches to one or more predetermined second electrodes of the capacitors of the capacitive digital to analog converter, thereby charging a code voltage onto the capacitors;

coupling the code voltage to successive approximation circuitry to successively approximate a digital value of the code voltage;

providing a second plurality of rank ordered switches to selectively couple the system reference voltage to substantially the same second electrodes of the capacitors while effecting said successive approximation; and providing the digital output word as an output value to be compared with said test code to determine the functionality of the analog to digital system, each bit of said digital output word controlling the switching of a predetermined one of the second plurality of switches.

5. The method of claim 4 wherein the plurality of capacitors are binarily ranked ordered.

6. In an analog to digital converter system having an accurate system reference voltage, a circuit for selectively testing the functionality of the system, comprising:

a rank ordered plurality of capacitors having first electrodes thereof coupled together and second electrodes;

a first plurality of rank ordered switching means, each of the first plurality of switching means having a first terminal coupled to a predetermined second electrode of the capacitors, and a second electrode selectively coupled to either the system reference voltage or a second reference voltage in response to a predetermined digital test code bit or to an approximation bit terminal;

a second plurality of rank ordered switching means, each of the second plurality of switching means having a first terminal coupled to a predetermined approximation bit terminal, a second terminal alternately coupled to the full value of the system reference voltage, and a control terminal; and a successive approximation register having a plurality of rank ordered conductors, each conductor being coupled to a predetermined digital output bit terminal and being coupled to a predetermined control terminal of the second plurality of switching means, said successive approximation means selectively evaluating digital output bits at said digital output bit terminals by selectively comparing the analog equivalent of the digital output bits with the analog equivalent of the digital test code bits.

7. The circuit of claim 6 wherein the rank ordered plurality of capacitors are binarily weighted and comprise a lower ordered section having the first electrodes thereof separated from the first electrodes of a higher ordered section by a scaling capacitor.

* * * * *